(12) United States Patent
Noll et al.

(10) Patent No.: US 8,937,501 B1
(45) Date of Patent: Jan. 20, 2015

(54) ACTIVE FIELD EFFECT TRANSISTOR LIMITER

(71) Applicant: M/A-COM Technology Solutions Holdings, Inc., Lowell, MA (US)

(72) Inventors: Alan L. Noll, Nashua, NH (US); Wayne M. Struble, Franklin, MA (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 3 days.

(21) Appl. No.: 13/943,041

(22) Filed: Jul. 16, 2013

(51) Int. Cl.
*H03L 5/00* (2006.01)
*H01P 1/22* (2006.01)
*H03K 17/16* (2006.01)

(52) U.S. Cl.
CPC ..................... *H03K 17/16* (2013.01)
USPC ......................... 327/309; 333/81 R (58) Field of Classification Search
USPC ................................. 327/306–361
See application file for complete search history.

(56) References Cited

U.S. PATENT DOCUMENTS

| | | | | | |
|---|---|---|---|---|---|
| 4,020,414 | A | * | 4/1977 | Paredes | 324/433 |
| 4,059,771 | A | * | 11/1977 | Jacobs et al. | 290/44 |
| 5,157,289 | A | | 10/1992 | Vasile | 307/542 |
| 5,309,309 | A | * | 5/1994 | Weber | 361/18 |
| 7,564,663 | B2 | | 7/2009 | Nicholson et al. | 361/56 |
| 8,169,204 | B2 | * | 5/2012 | Jian | 323/277 |

* cited by examiner

*Primary Examiner* — Dinh Le
(74) *Attorney, Agent, or Firm* — Christopher P. Maiorana, PC (57) ABSTRACT

An apparatus having a detector and a circuit is disclosed. The detector may be configured to generate a control signal in response to a voltage level of an input signal. The circuit may be configured to (i) connect the input signal to a reference signal with a first impedance in response to the control signal in an asserted state and (ii) connect the input signal to the reference signal with a second impedance in response to the control signal in a deasserted state. One or more transistors in the circuit are generally biased to an off state while the control signal is in the deasserted state.

18 Claims, 10 Drawing Sheets

ACTIVE FIELD EFFECT TRANSISTOR LIMITER

FIELD OF THE INVENTION

The present invention relates to switch limiters generally and, more particularly, to a method and/or apparatus for implementing an active field effect transistor limiter.

BACKGROUND OF THE INVENTION

Limiters are commonly used to protect power sensitive receiver components from external unwanted power sources such as radar, electronic warfare transmitters or from unwanted reflections within the operating system. Under normal operating conditions, the limiters offer low insertion loss thereby sustaining the receiver noise figure and linearity. When subjected to high-power signals, an impedance of the limiters is reduced to reflect the unwanted power away from the receiver.

Conventional limiters are restricted in power handling and scattering-parameter performance by a periphery parameter as related to the level of the input power applied. Large devices have a characteristic of high capacitance. Therefore, large devices increase the insertion loss of the limiter and noise figure of the system. When the devices are configured in an array to enhance the power handling capability, the resultant higher capacitance increases the insertion loss.

It would be desirable to implement an active field effect transistor limiter.

SUMMARY OF THE INVENTION

The present invention concerns an apparatus having a detector and a circuit. The detector may be configured to generate a control signal in response to a voltage level of an input signal. The circuit may be configured to (i) connect the input signal to a reference signal with a first impedance in response to the control signal in an asserted state and (ii) connect the input signal to the reference signal with a second impedance in response to the control signal in a deasserted state. One or more transistors in the circuit are generally biased to an off state while the control signal is in the deasserted state.

The objects, features and advantages of the present invention include providing an active field effect transistor limiter that may (i) actively change impedance based on a power/voltage of an input signal, (ii) passively change impedances in some stages based on a voltage of the input signal, (iii) reflect power surges in the input signal, (iv) partially absorb the power surges in the input signal, (v) have a low insertion loss compared with conventional designs, (vi) handle high power levels compared with the conventional designs, (vii) have a low power leakage level compared with the conventional designs, (viii) occupy a small substrate area and/or (ix) be implemented on an integrated circuit.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Some embodiments of the present invention generally provide active transistor limiters that use large periphery (e.g., large total gate width) field effect transistors. The limiters may be configured with a detector circuit to increase a power-handling capability, reduce an insertion loss and allow for integration with other receiver functions as an integrated circuit or as an individual device. Criteria of the limiters generally include, but are not limited to, operating at power levels up to several (e.g., 10) watts, providing a leakage level of less than several (e.g. 250) milliwatts and having an insertion loss less than a few (e.g., 0.5) decibels (e.g., dB) in a microwave frequency range (e.g., 0.5 to 30 gigahertz—GHz).

Figure 1:
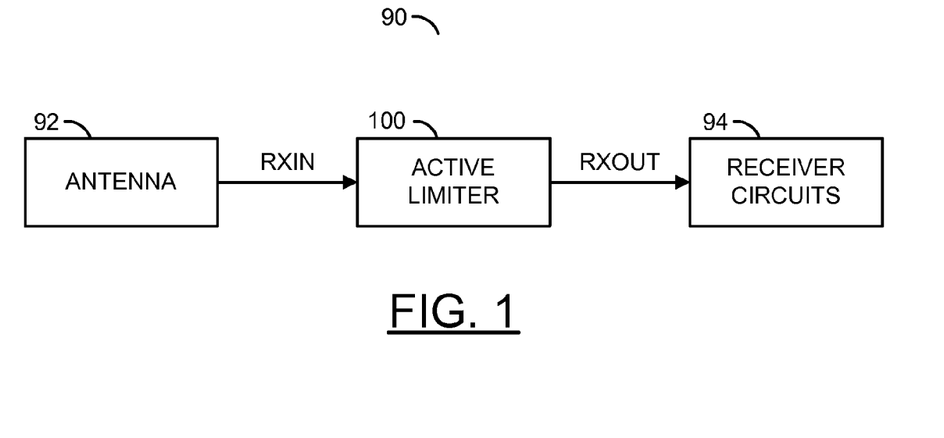
FIG. 1 is a block diagram of a receiver system.

Referring to FIG. 1, a block diagram of an example implementation of a system 90 is shown. The system (or apparatus) 90 may implement a receiver system. The system 90 generally comprises a block (or circuit) 92, a block (or circuit) 94 and a block (or circuit) 100. The circuits 92 to 100 may be implemented in hardware and/or software executing on hardware.

A signal (e.g., RXIN) may be transferred from the circuit 92 to the circuit 100. The signal RXIN may convey a received signal carrying information. A signal (e.g., RXOUT) may be transferred from the circuit 100 to the circuit 94. The signal RXOUT may be a modified version of the received signal with power and/or voltage surges in the signal RXIN attenuated.

The circuit 92 may implement an antenna circuit. The circuit 92 is generally operational to receive the information and generate the signal RXIN. Other operations of the circuit 92 may include, but are not limited to, amplification, demodulation, discrimination, filtering and gain adjustments.

The circuit 94 may implement one or more receiver circuits. The circuit 94 is generally operational to process the information received in the signal RXOUT. The processing may include, but is not limited to frequency shifting, detection and phase adjustments.

The circuit 100 may implement an active limiter circuit. The circuit 100 is generally operational to limit power and/or voltage surges in the signal RXIN by actively changing an impedance seen by the circuit 92 looking into the circuit 100. During normal operation, the circuit 100 may provide proper (or matched) termination impedance, low insertion loss and good conductivity of the signal RXIN to the signal RXOUT. When a power/voltage surge is detected, the circuit 100 may be operational to reduce the impedance seen by the circuit 92. The low impedance generally shorts the surge to ground. The low impedance may also cause a termination impedance mismatch that reflects a portion of the power of the incoming signal RXIN. Some power of the signal RXIN may still be passed through the circuit 100 to the signal RXOUT.

Figure 2:
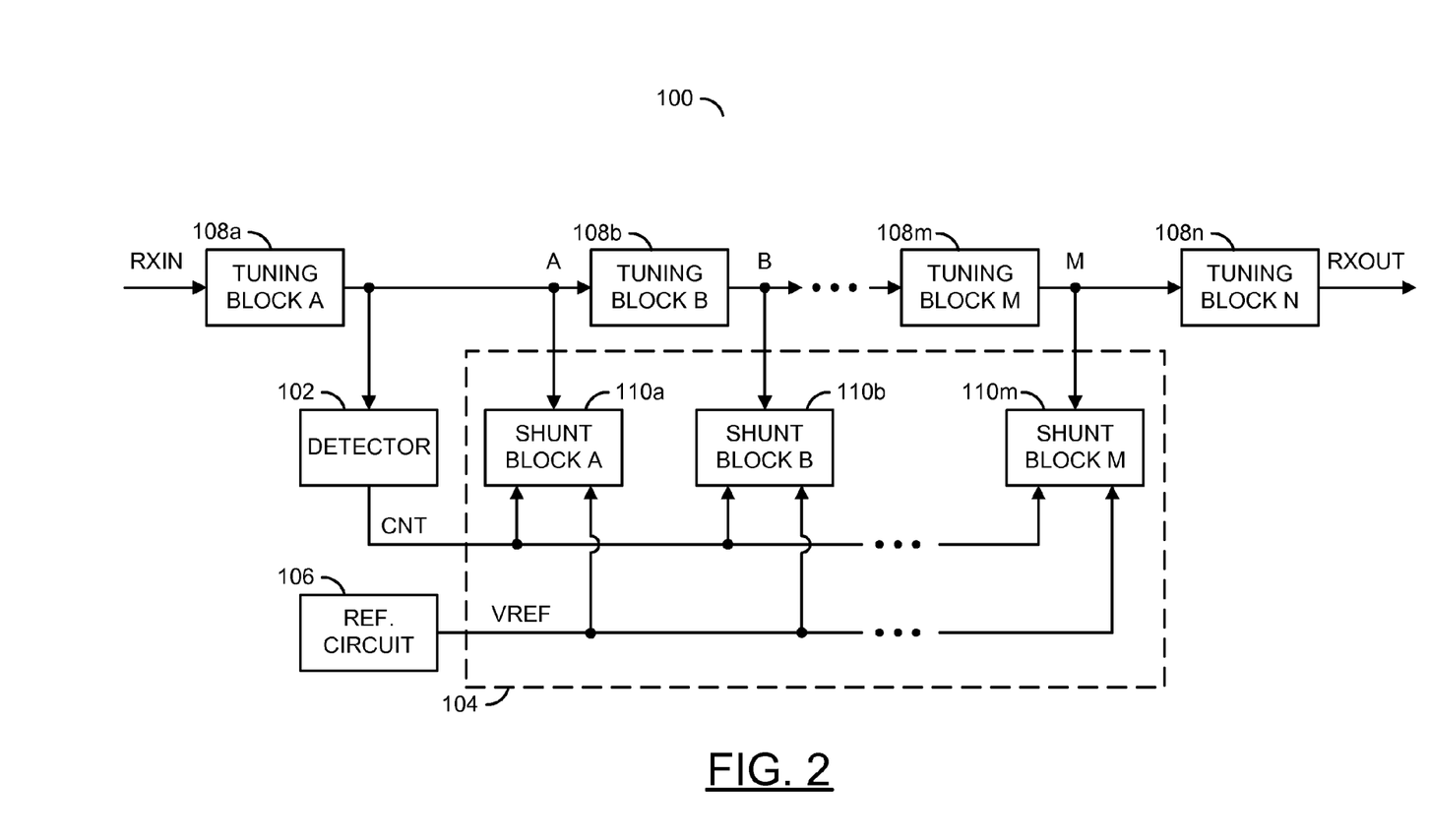
FIG. 2 is a block diagram of a limiter circuit.

Referring to FIG. 2, a block diagram of an example implementation of the circuit 100 is shown in accordance with a preferred embodiment of the present invention. The circuit (or apparatus, device, component or integrated circuit) 100 generally comprises a block (or circuit) 102, a block (or circuit) 104, a block (or circuit) 106 and one or more blocks (or circuits) 108a-108n. The circuit 104 generally comprises multiple blocks (or circuits) 110a-110m. In some embodiments, the circuits 102-110m may be implemented exclusively in hardware. In some embodiments, the circuit 100 is fabricated on one or more semiconductor (e.g., Gallium Arsenide) substrates to form one or more integrated circuits.

The signal RXIN may be received by the circuit 108a. A sequence of signals (e.g., A, B, . . . , M) may be generated by the circuits 108a-108m and transferred to an adjoining circuit 108b-108n and a corresponding circuit 110a-110m. The signal A may also be transferred from the circuit 108a to the circuit 102. Each signal A-M may implement a filtered version of the signal RXIN. A signal (e.g., CNT) may be generated by the circuit 102 and presented to the circuits 110a-110m. The signal CNT may implement a control signal. While the circuit 100 is in a normal (or non-limiting) mode of operation, the signal CNT may be deasserted. While the circuit 100 is in an active (or limiting) mode of operation, the signal CNT may be asserted. A signal (e.g., VREF) may be generated by the circuit 106 and transferred to the circuits 110a-110m. The signal VREF generally implements a reference voltage used to bias transistors in the circuits 110a-110m.

The circuit 102 may implement a detector circuit. The circuit 102 is generally operational to detect when a voltage level of the signal A has exceeded a threshold voltage. The threshold voltage may be established internally to the circuit 102. While the signal A is below the threshold voltage, the circuit 102 may deassert the signal CNT (e.g., generate a low voltage) and thus the circuit 100 is the normal mode. While the signal A is above the threshold voltage, the circuit 102 may assert the signal CNT (e.g., generate a high voltage) and thus the circuit 100 may be in the active mode.

The circuit 104 generally implements a shunt circuit. The circuit 104 may be operational to actively change impedances between the signals A-M and the signal VREF and/or ground based on the voltage conveyed by the signal CNT. While the signal CNT is in the deasserted state, the circuit 104 may present a predetermined impedance between the signals A-M and the signals VREF/ground. While the signal CNT is in the asserted state, the circuit 104 may change (e.g., lower) the impedance to the signals VREF/ground.

Each circuit 108a-108n may implement a tuning circuit. The circuits 108a-108n are generally operational to provide a frequency tuning (or filtering) of the signals RXIN and A-M. The tuning may be established to meet the frequencies of the anticipated pulses on the signal RXIN.

Each circuit 110a-110m may implement a shunt circuit. Some or all of the circuits 110a-110m are generally operational to provide an impedance path between a corresponding signal A-M and the signals VREF/ground. The impedance may be actively adjusted by the signal CNT. One or more of the circuits 110a-110m may be operational to provide a passive shunting capability to ground. When the corresponding voltage A-M exceeds a positive threshold or a negative threshold, the passive circuits 110a-110m may change (e.g., reduce) the impedance along an internal path between the corresponding signal A-M and ground.

Figure 3:
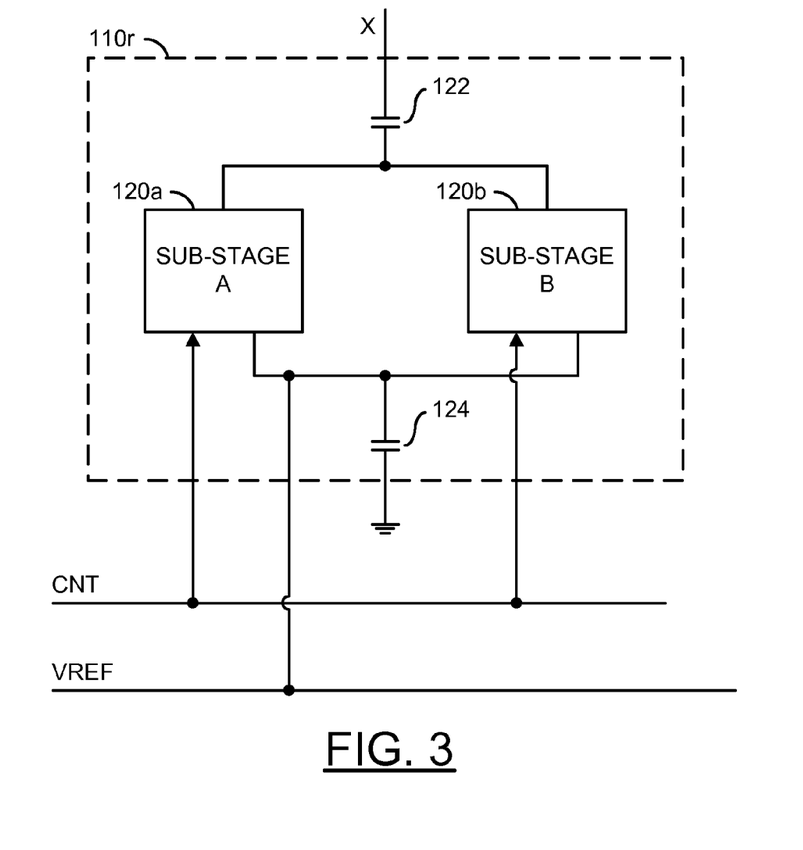
FIG. 3 is a block diagram of a shunt circuit.

Referring to FIG. 3, a block diagram of an example implementation of a circuit 110r is shown. The circuit 110r may be representative of one or more of the circuits 110a-110m. The circuit 110r generally comprises multiple blocks (or circuits) 120a-120b, a capacitor 122 and a capacitor 124. In some embodiments, the circuits 120a-124 may be implemented exclusively in hardware.

A signal (e.g., X) may be received by the capacitor 122. The signal X may be representative of the signal A-M. The signal CNT may be generated by the circuit 102 and received by the circuits 120a-120b. The signal VREF generated by the circuit 106 may also be received by the circuits 120a-120b and an end of the capacitor 124. Another end of the capacitor 124 may be connected to ground.

Each circuit 120a-120b may implement a shunt sub-circuit. The circuits 120a-120b are generally operational to actively change an impedance in response to the signal CNT. Each circuit 120a-120b may provide a predetermined impedance between the signal X and the signals VREF/ground while the signal CNT is in the deasserted state. Each circuit 120a-120b may provide a lower impedance between the signal X and the signals VREF/ground while the signal CNT is asserted. A path between the signal X and the signal VREF may be a DC path. A path between the signal X and ground may be an AC path.

Figure 4:
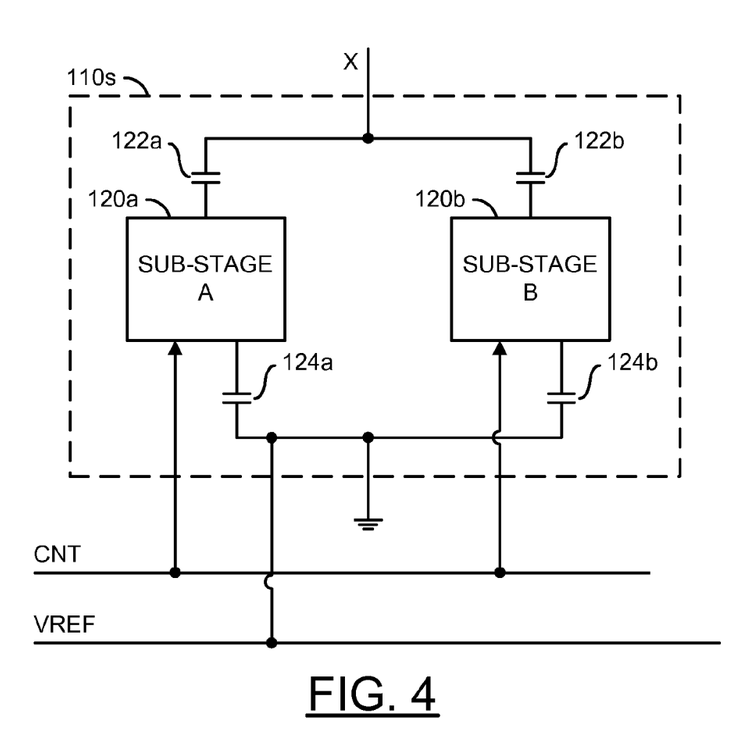
FIG. 4 is a block diagram of another shunt circuit.

Referring to FIG. 4, a block diagram of an example implementation of another circuit 110s is shown. The circuit 110s may be representative of one or more of the circuits 110a-110m. The circuit 110s is generally a variation of the circuit 110r. The circuit 110s generally comprises the circuits 120a-120b, two capacitors 122a-122b and two capacitors 124a-124b. The two capacitors 122a-122b may be implemented in place of the capacitor 122, one capacitor 122a-122b connected to each respective circuit 120a-120b. The two capacitors 124a-124b may be implemented in place of the capacitor 124, one capacitor 124a-124b connected to each respective circuit 120a-120b.

Figure 5:
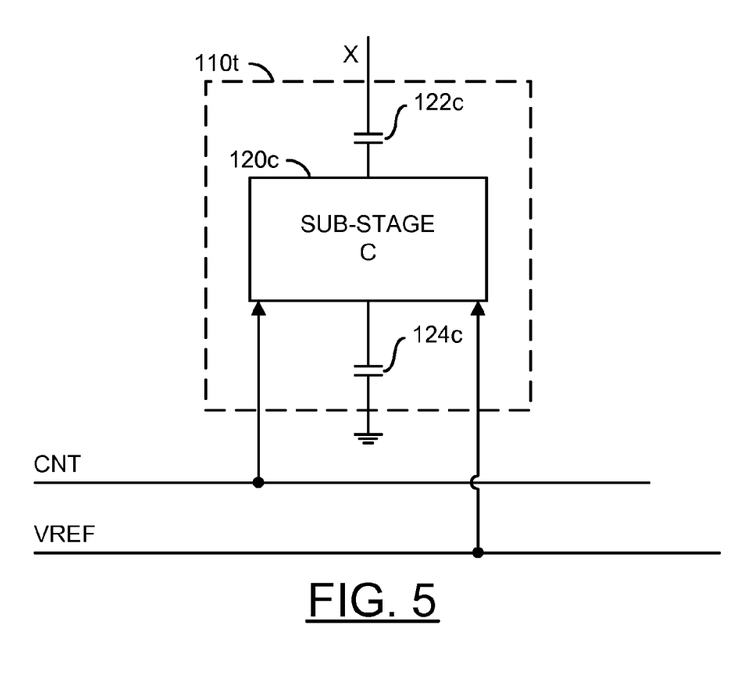
FIG. 5 is a block diagram of another shunt circuit.

Referring to FIG. 5, a block diagram of an example implementation of still another circuit 110t is shown. The circuit 110t may be representative of one or more of the circuits 110a-110m. The circuit 110t may be a variation of the circuits 110r. The circuit 110t may have a single shunt sub-circuit 120c instead of the two circuits 120a-120b. The circuit 110t may also have capacitors 122c and 124c that connect the circuit 120c to the signal X and ground, respectively.

The circuit 120c may implement a shunt sub-circuit. The circuit 120c is generally operational to actively change an impedance in response to the signal CNT. The circuit 120c may provide a predetermined impedance between the signal X and the signals VREF/ground while the signal CNT is in the deasserted state. The circuit 120c may provide a lower impedance between the signal X and the signals VREF/ground while the signal CNT is asserted. The path between the signal X and the signal VREF may be a DC path. The path between the signal X and ground may be an AC path.

Figure 6:
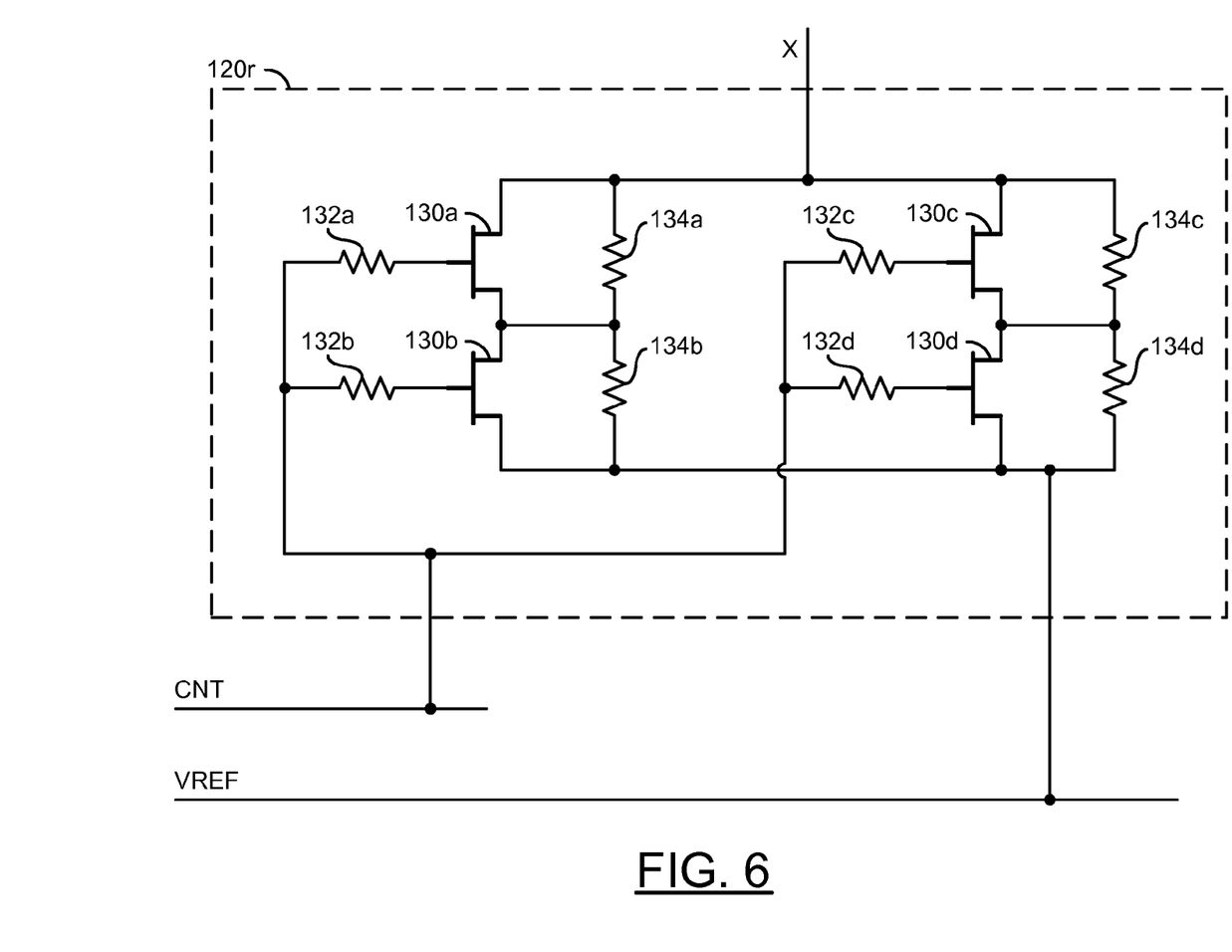
FIG. 6 is a schematic of an active sub-circuit.

Referring to FIG. 6, a schematic of an example implementation of an active circuit 120r is shown. The circuit 120r may be representative of one or more of the circuits 120a-120c. The circuit 120r generally comprises one or more transistors 130a-130d, one or more gate resistors 132a-132d and one or more drain-to-source shunt resistors 134a-134d. The transistors 132a and 132b may be connected in series. Likewise, the transistors 130c and 130d may also be connected in series. Each pair of transistors 130a+130b and 130c+130d may be connected in parallel. The parallel connections generally provide two paths through the circuit 120r between the signal X and the signals VREF/ground.

Each transistor 130a-130d may be implemented as a field effect transistor. In some embodiments, the transistors 130a-130d may be n-channel depletion mode junction field effect transistors. The transistors 130a-130d may each have one, two, three or more gates. In some embodiments, each transistor 130a-130d may have a total gate periphery ranging from 500 to 900 microns (e.g., µm). Other transistor technologies and gate peripheries may be implemented to meet the criteria of a particular application.

The signal VREF may bias a gate-to-source voltage of the transistors 130a-130d above a pinch-off voltage while the signal CNT is deasserted (or at a low voltage or a ground voltage). The transistors 130a-130d may operate in a high impedance state (e.g., an off state condition) for a source-to-drain current while the gate-to-source voltage is above the pinch-off voltage. While the signal CNT is in the active state (e.g., a voltage that takes the transistors 130a-130b out of the pinch-off condition), the source-to-drain current may increase and so the impedance seen through the transistors 130a-130d is generally reduced.

The number and size of the transistors 130a-130d may be determined by system criteria to reduce leakage levels. For example, the circuit 120r may have a single transistor (e.g., 130a), gate resistor (e.g., 132a) and shunt resistor (e.g., 134a), depending on the levels of the signals RXIN and/or RXOUT for a particular application. A DC voltage with a value above the pinch-off voltage of the transistors 130a-130d may be selected and supplied by the circuit 106. The signal VREF may carry a current greater than a total transistor leakage current.

Figure 7:
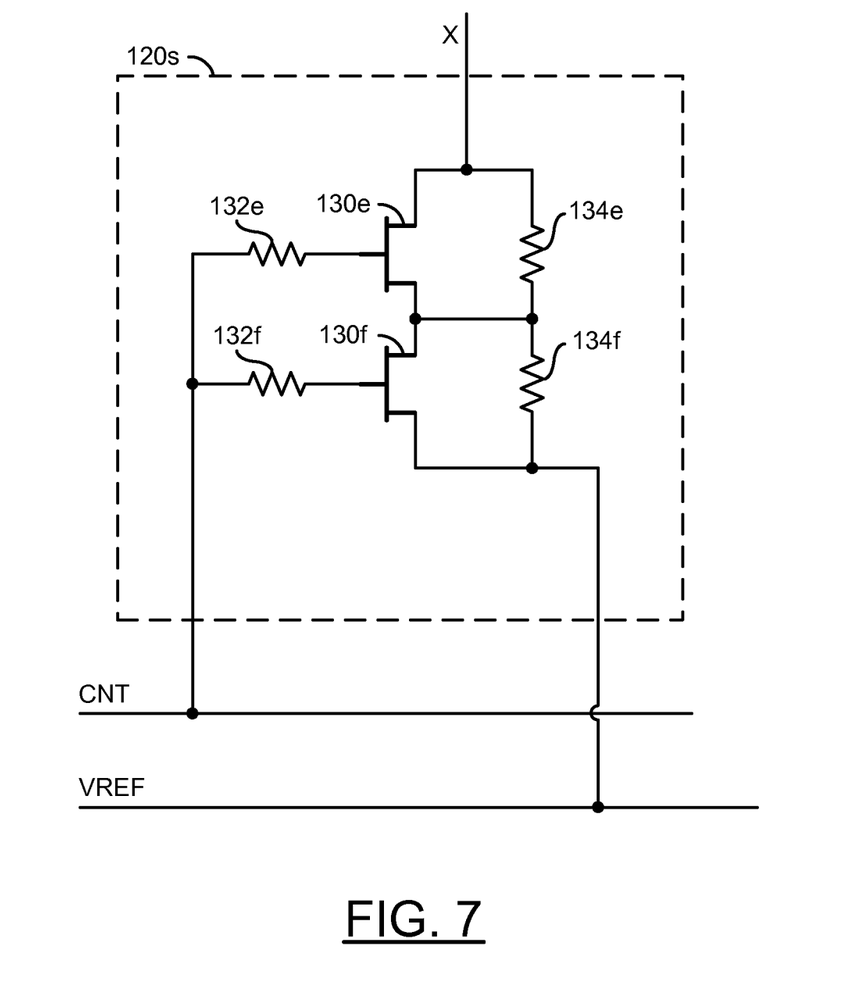
FIG. 7 is a schematic of another active sub-circuit.

Referring to FIG. 7, a schematic of an example implementation of another active circuit 120s is shown. The circuit 120s may be representative of one or more of the circuits 120a-120c. The circuit 120s generally comprises one or more transistors 130e-130f, one or more gate resistors 132e-132f and one or more drain-to-source shunt resistors 134e-134f. The transistors 130e and 130f may be connected in series. The series connection generally provides a single path through the circuit 120s between the signal X and the ground signal.

Each transistor 130a-130f may be implemented as a field effect transistor. In some embodiments, the transistors 130a-130f may be n-channel depletion mode junction field effect transistors. The transistors 130a-130f may each have one, two, three or more gates. In some embodiments, each transistor 130a-130f may have a total gate periphery ranging from 500 to 3000 µm. Other transistor technologies and gate peripheries may be implemented to meet the criteria of a particular application. In some embodiments, the circuit 120s may have a single transistor (e.g., 130e) gate resistor (e.g., 132e) and shunt resistor (e.g., 134e), depending on the levels of the signals RXIN and/or RXOUT for a particular application.

Figure 8:
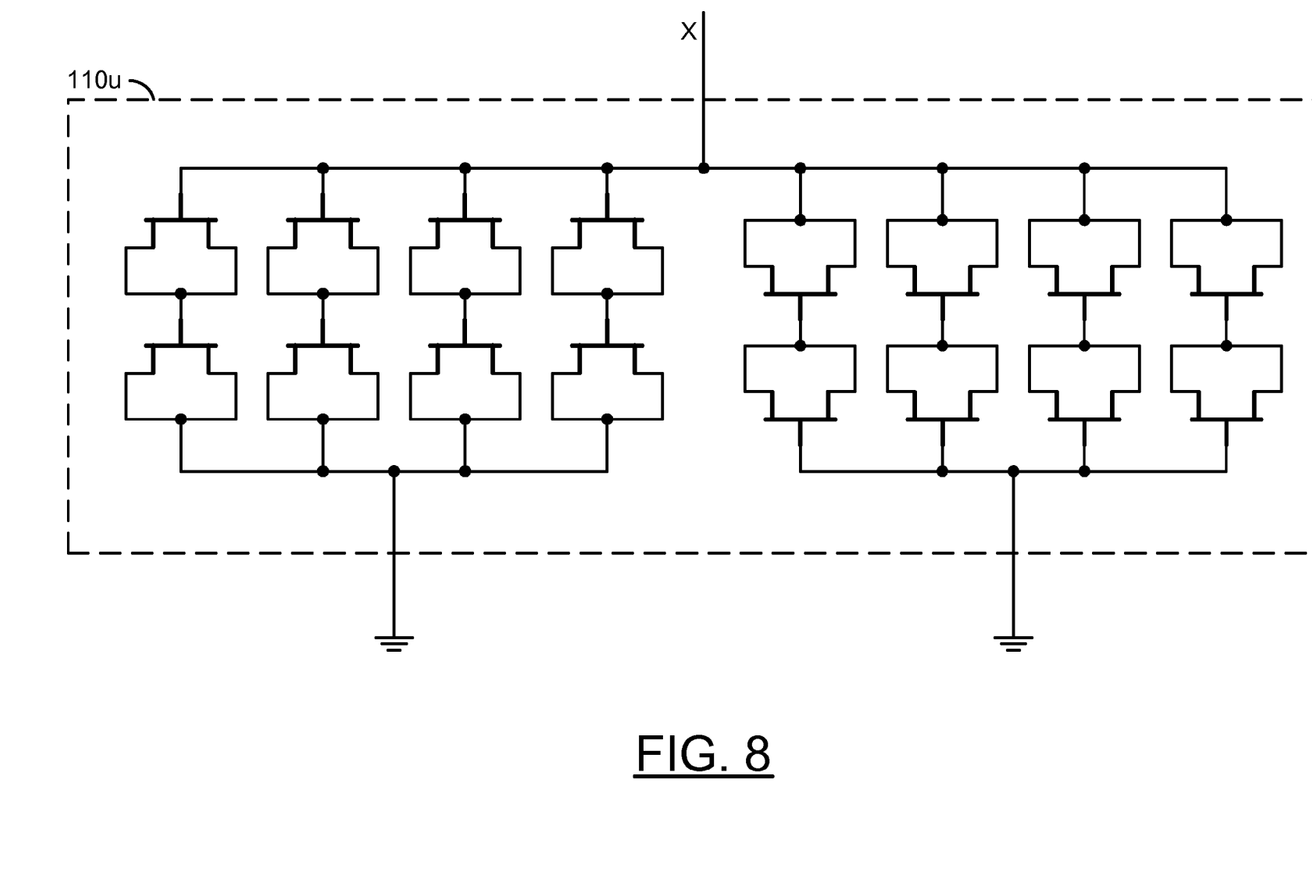
FIG. 8 is a schematic of a passive sub-circuit.

Referring to FIG. 8, a schematic of an example implementation of a passive circuit 110u is shown. The circuit 110u may be representative of one or more of the circuits 110a-110m. The circuit 110u generally comprises multiple transistors. Each transistor may be wired to operate as a diode. Half of the transistors (diodes) are generally interconnected as multiple parallel paths between the signal X and ground for positive pulses. The other half of the transistors may be interconnected as multiple parallel paths between the signal X and ground for negative pulses. Each path generally contains multiple transistors (diodes) wired in series. While the signal X is several diode-threshold voltages above ground, half the diodes become forward biased and clamp the signal X to ground. While the signal X is several diode-threshold voltages below the ground voltage, the other half of the diodes become forward biased and clamp the signal X to ground. Since the circuit 110u does not depend on the rise time of the signal CNT, the circuit 110u may respond rapidly to changing voltages in the signal X.

Each transistor (diode) may be implemented as a field effect transistor. In some embodiments, the transistors may be n-channel depletion mode junction field effect transistors. The transistors may each have one, two, three or more gates. In some embodiments, each transistor may have a total gate periphery ranging from 10 to 50 µm. Other transistor technologies and gate peripheries may be implemented to meet the criteria of a particular application.

Figure 9:
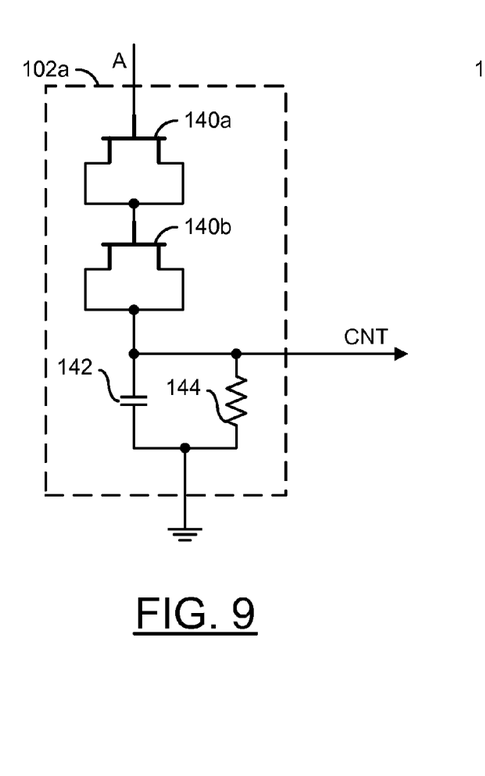
FIG. 9 is a schematic of a detector circuit.

Referring to FIG. 9, a schematic of an example implementation of a circuit 102a is shown. The circuit 102a may be a representative embodiment of the circuit 102. The circuit 102a generally comprises multiple transistors 140a-140b, a capacitor 142 and a resistor 144. In some embodiments, the circuits 140a-144 may be implemented exclusively in hardware.

Each transistor 140a-140b may be wired to operate as a diode. The transistors 140a-140b may be wired in series such that the signal CNT is pulled to a high voltage (e.g., the asserted state) while the signal A is a couple (e.g., two) diode thresholds or greater than the ground potential. While the signal A is less than the couple of diode thresholds above ground, the signal CNT may be pulled to a low voltage (e.g., the deasserted state) by a filter formed by the capacitor 142 and the resistor 144. The decoupled array of transistors 140a-140b generally provides a rectified voltage on the signal CNT. The voltage may be DC coupled to the gates of the transistors in the circuits 110a-110m. In some embodiments, the circuit 102a may have a signal transistor between the signal A and the signal CNT.

Figure 10:
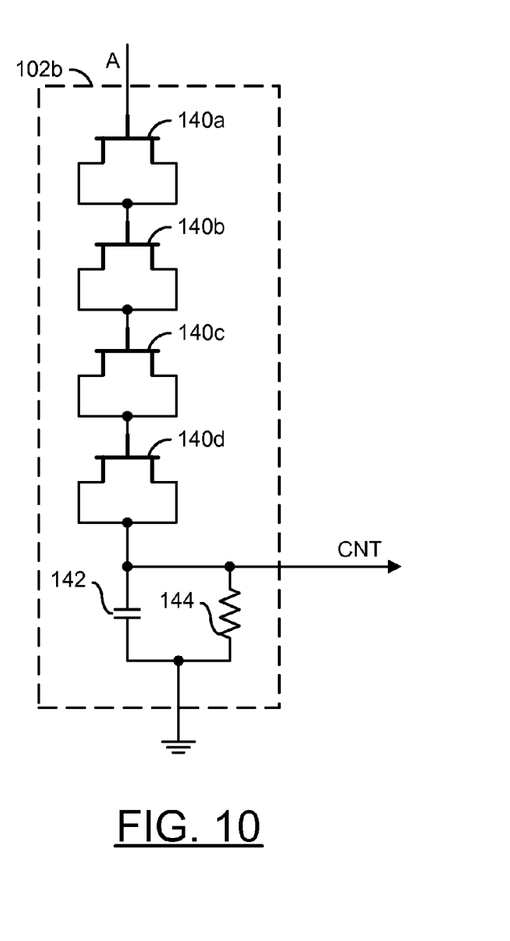
FIG. 10 is a schematic of another detector circuit.

Referring to FIG. 10, a schematic of an example implementation of a circuit 102b is shown. The circuit 102b may be another representative embodiment of the circuit 102. The circuit 102b generally comprises multiple transistors 140a-140d, the capacitor 142 and the resistor 144. In some embodiments, the circuits 140a-144 may be implemented exclusively in hardware.

Each transistor 140a-140d may be wired to operation as a diode. The transistors 140a-140d may be wired in series such that the signal CNT is pulled to a high voltage (e.g., the asserted state) while the signal A is multiple (e.g., four) diode thresholds or greater than the ground potential. While the signal A is less than the multiple diode thresholds above ground, the signal CNT may be pulled to a low voltage (e.g., the deasserted state) by the filter formed by the capacitor 142 and the resistor 144. The numbers of transistors 140a-140d is generally determined by a level of the input power, the RF output leakage power and the power dissipation. Other numbers of transistors 140a-140d may be implemented to meet the criteria of a particular application.

Each transistor 140a-140d may be implemented as a field effect transistor. In some embodiments, the transistors may be n-channel depletion mode junction field effect transistors. The transistors may each have one, two, three or more gates. In some embodiments, each transistor 140a-140d may have a total gate periphery ranging from 10 to 50 µm. Other transistor technologies and gate peripheries may be implemented to meet the criteria of a particular application.

Figure 11:
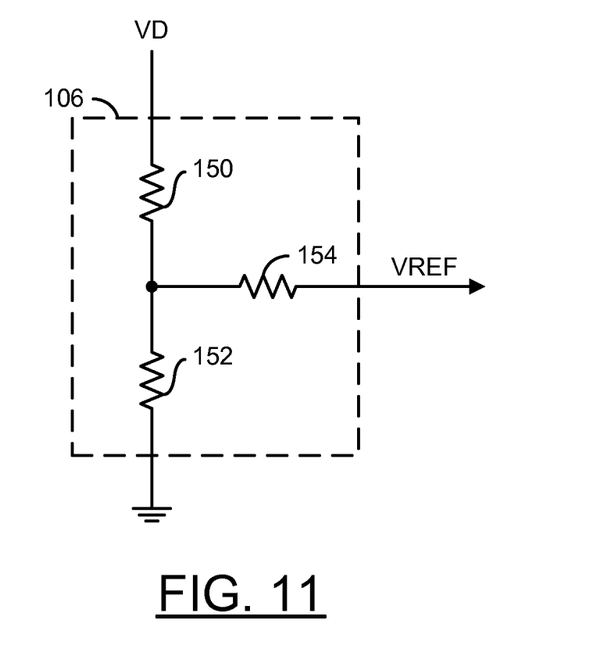
FIG. 11 is a schematic of a reference circuit.

Referring to FIG. 11, a schematic of an example implementation of the circuit 106 is shown. The circuit 106 generally comprises multiple resistors 150, 152 and 154. In some embodiments, the resistors 150-154 may be implemented exclusively in hardware.

The resistors 150 and 152 may be arranged as a voltage divider of a signal (e.g., VD). The signal VD may implement a power supply signal. The resistor 154 may be connected between the resistors 150 and 152 to sample the signal VREF. The resistor 154 generally implements a high resistance to avoid a significant current drain from VREF.

Figure 12:
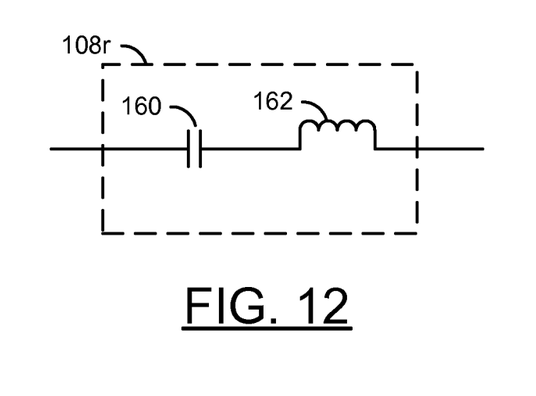
FIG. 12 is a schematic of a tuning circuit.

Referring to FIG. 12, a schematic of an example implementation of a circuit 108r is shown. The circuit 108r may be a representative embodiment of the circuits 108a-108n. The circuit 108r generally comprises one or more of a capacitor 160 and an inductor 162. In some embodiments, the components 160-162 may be implemented exclusively in hardware.

A capacitance value of the capacitor 160 and/or an inductance value of the inductor 162 may be set to meet the tuning criteria of a particular application. In some embodiments, the capacitor 160 may be eliminated (e.g., eliminated in the circuit 108b). In other embodiments, the inductor 162 may be eliminated (e.g., eliminated in the circuit 108n).

Figure 13:
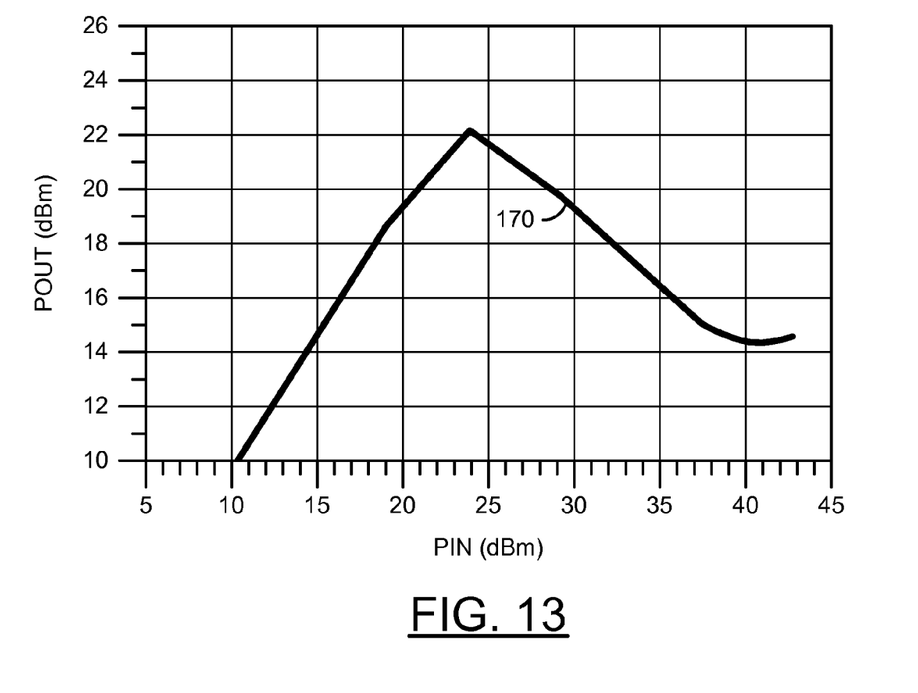
FIG. 13 is a graph illustrating a measured power in versus a power out at a middle frequency.

Referring to FIG. 13, a graph illustrating a measured power in versus a power out of an example embodiment of the circuit 100 at a middle frequency is shown. The circuit 104 generally has two circuits 110a-110b in the example (e.g., see FIG. 2). The circuit 110a may have eight 900 μm transistors (e.g., see FIGS. 3 and 6). The circuit 110b may have two 2000 μm transistors (e.g., see FIGS. 5 and 7). The circuit 102 generally has four 30 μm diodes (e.g., see FIG. 10).

A curve 170 illustrates how the power out in the signal RXOUT tracks the power received in the signal RXIN in approximately a linear manner below an input power of approximately 22 decibels referenced to one milliwatt (e.g., dBm). For greater input powers, the circuit 100 generally reduces the output power by both absorbing and reflecting the input power up to approximately 40 dBm.

Figure 14:
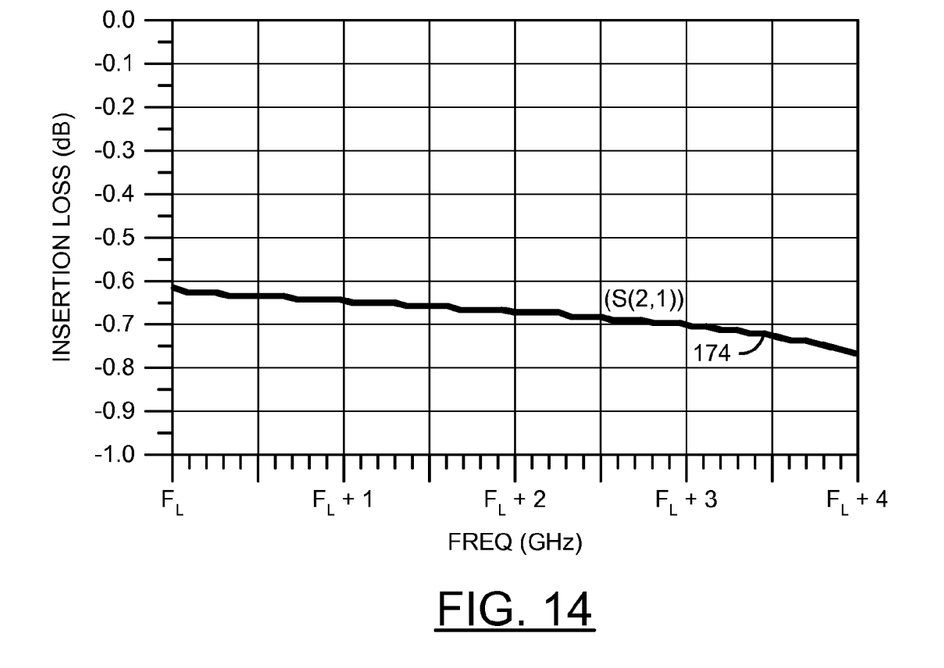
FIG. 14 is a graph illustrating a measured insertion loss.

Referring to FIG. 14, a graph illustrating a measured insertion loss of the example embodiment of the circuit 100 is shown. A curve 174 generally shows the insertion loss in terms of a scattering parameter (e.g., forward complex transmission coefficient S(2,1)). The insertion loss varies by less than 0.2 dB over a frequency range of $F_L$ GHz to $F_L$ GHz+4 GHz, where $F_L$ is a lower frequency.

Figure 15:
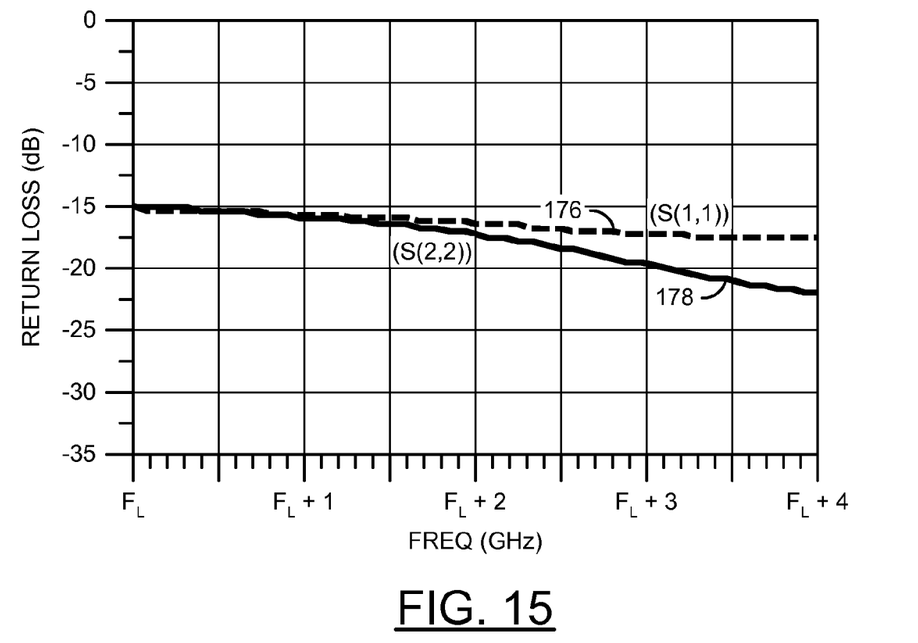
FIG. 15 is a graph illustrating a measured return loss.

Referring to FIG. 15, a graph illustrating a measured return loss of the example embodiment of the circuit 100 is shown. A curve 176 may illustrate an input return loss in terms of a scattering parameter (e.g., an input complex reflection coefficient S(1,1)). A curve 178 may illustrate an output return loss in terms of a scattering parameter (e.g., an output complex reflection coefficient S(2,2)).

Figure 16:
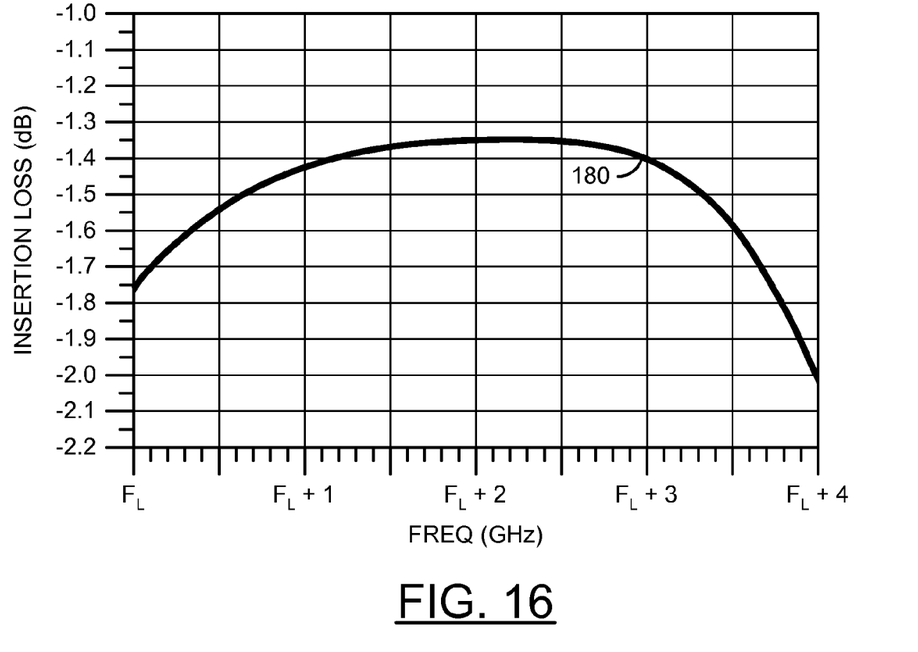
FIG. 16 is a graph illustrating another measured insertion loss.

Referring to FIG. 16, a graph illustrating another measured insertion loss of the example embodiment of the circuit 100 is shown. A curve 180 may illustrate the insertion loss in terms of a scattering parameter (e.g., a near end crosstalk coefficient S(3,1)). The insertion loss generally varies by approximately 0.7 dB over the range of $F_L$ GHz to $F_L$ GHz+4 GHz.

The functions and structures illustrated in the diagrams of FIGS. 1-12 may be designed, modeled and simulated using one or more of a conventional general purpose processor, digital computer, microprocessor, microcontroller and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors.

While the invention has been particularly shown and described with reference to the preferred embodiments thereof, it will be understood by those skilled in the art that various changes in form and details may be made without departing from the scope of the invention.

The invention claimed is:

1. An apparatus comprising:
  a detector configured to generate a control signal in response to a voltage level of an input signal in a microwave frequency range; and
  a circuit configured to (i) connect said input signal to a reference signal with a first impedance in response to said control signal in an asserted state and (ii) connect said input signal to said reference signal with a second impedance in response to said control signal in a deasserted state, wherein (a) said reference signal biases one or more transistors in said circuit above a pinch-off voltage to an off state while said control signal is in said deasserted state and (b) said reference signal is offset from a ground voltage of said circuit.

2. The apparatus according to claim 1, wherein (i) said circuit has a plurality of DC paths that connect said input signal to said reference signal and (ii) one or more AC paths connect said input signal to said ground voltage.

3. The apparatus according to claim 1, wherein said transistors are field effect transistors each having a source biased by said reference signal.

4. The apparatus according to claim 1, further comprising an additional circuit configured to connect said input signal to said reference signal with different impedances based on said control signal.

5. The apparatus according to claim 4, further comprising a tuning circuit configured to filter said input signal between said circuit and said additional circuit.

6. The apparatus according to claim 1, further comprising an additional circuit configured to connect said input signal to said reference signal with different impedances based on said voltage level of said input signal.

7. The apparatus according to claim 1, wherein a number of diodes in said detector determine when said control signal is in said asserted state and said deasserted state.

8. The apparatus according to claim 1, wherein said apparatus is implemented as an integrated circuit.

9. The apparatus according to claim 1, further comprising an additional circuit configured to (i) receive said input signal in parallel with said circuit and (ii) generate an output signal by filtering said input signal, wherein an output power of said output signal (a) tracks an input power of said input signal while said input power is below a threshold and (b) is reduced relative to said input power while said input power is above said threshold.

10. A method for active transistor limiting, comprising the steps of:
  (A) generating a control signal in response to a voltage level of an input signal in a microwave frequency range;
  (B) connecting said input signal to a reference signal with a first impedance through a circuit in response to said control signal in an asserted state; and
  (C) connecting said input signal to said reference signal with a second impedance through said circuit in response to said control signal in a deasserted state, wherein (a) said reference signal biases one or more transistors in said circuit above a pinch-off voltage to an off state while said control signal is in said deasserted state and (b) said reference signal is offset from a ground voltage of said circuit.

11. The method according to claim 10, wherein (i) said connecting of said input signal to said reference signal follows a plurality of DC paths through said circuit and (ii) one or more AC paths connect said input signal to said ground voltage.

12. The method according to claim 10, wherein said transistors are field effect transistors each having a source biased by said reference signal.

13. The method according to claim 10, further comprising the step of:
   connecting said input signal to said reference signal through an additional circuit with different impedances based on said control signal.

14. The method according to claim 13, further comprising the step of:
   filtering said input signal between said circuit and said additional circuit.

15. The method according to claim 10, further comprising the step of:
   connecting said input signal to said reference signal through an additional circuit with different impedances based on said voltage level of said input signal.

16. The method according to claim 10, wherein a number of diodes in a detector circuit determine when said control signal is in said asserted state and said deasserted state.

17. The method according to claim 10, further comprising the steps of:
   receiving said input signal in parallel at said circuit and an additional circuit; and
   generating an output signal from said additional circuit by filtering said input signal, wherein an output power of said output signal (i) tracks an input power of said input signal while said input power is below a threshold and (ii) is reduced relative to said input power while said input power is above said threshold.

18. An apparatus comprising:
   means for generating a control signal in response to a voltage level of an input signal in a microwave frequency range; and
   means for connecting said input signal to a reference signal (i) with a first impedance in response to said control signal in an asserted state and (ii) with a second impedance in response to said control signal in a deasserted state, wherein (a) said reference signal biases one or more transistors in said means for connecting above a pinch-off voltage to an off state while said control signal is in said deasserted state and (b) said reference signal is offset from a ground voltage of said apparatus.

* * * * *